(12) United States Patent
Shia et al.

(10) Patent No.: US 6,519,153 B1
(45) Date of Patent: Feb. 11, 2003

(54) HEAT SINK RETENTION FRAME

(75) Inventors: David Shia, Redmond, WA (US); Thomas J. Wong, Seattle, WA (US)

(73) Assignee: Intel Corporation, Hillsboro, OR (US)

( * ) Notice: Subject to any disclaimer, the term of this patent is extended or adjusted under 35 U.S.C. 154(b) by 0 days.

(21) Appl. No.: 09/925,714

(22) Filed: Aug. 8, 2001

(51) Int. Cl.⁷ .................................................. H05K 7/20
(52) U.S. Cl. ...................... 361/704; 257/719; 24/458; 165/80.3; 165/185; 361/710; 361/719; 361/720
(58) Field of Search ................................. 361/687–688, 361/690, 703–704, 709–710, 717–721; 165/80.2, 80.3, 185; 174/16.3; 257/706, 713, 717–719, 722, 726–727; 24/458, 520, 295–296; 439/485, 71, 131, 73, 66, 526, 407

(56) References Cited

U.S. PATENT DOCUMENTS

| | | |
|---|---|---|
| 6,075,702 A | 6/2000 | Gardner et al. |
| 6,180,874 B1 | 1/2001 | Brezina et al. |
| 6,205,026 B1 | 3/2001 | Wong et al. |

*Primary Examiner*—Gregory Thompson
(74) *Attorney, Agent, or Firm*—Fish & Richardson P.C.

(57) ABSTRACT

An assembly is disclosed including a printed circuit board, a single piece heat sink retention frame secured to the printed circuit board, the frame comprising four structural members surrounding an aperture, an integrated circuit chip secured to the printed circuit board and positioned within the aperture and a heat sink secured to the frame, the heat sink positioned above the integrated circuit chip and at least partially within the aperture.

21 Claims, 4 Drawing Sheets

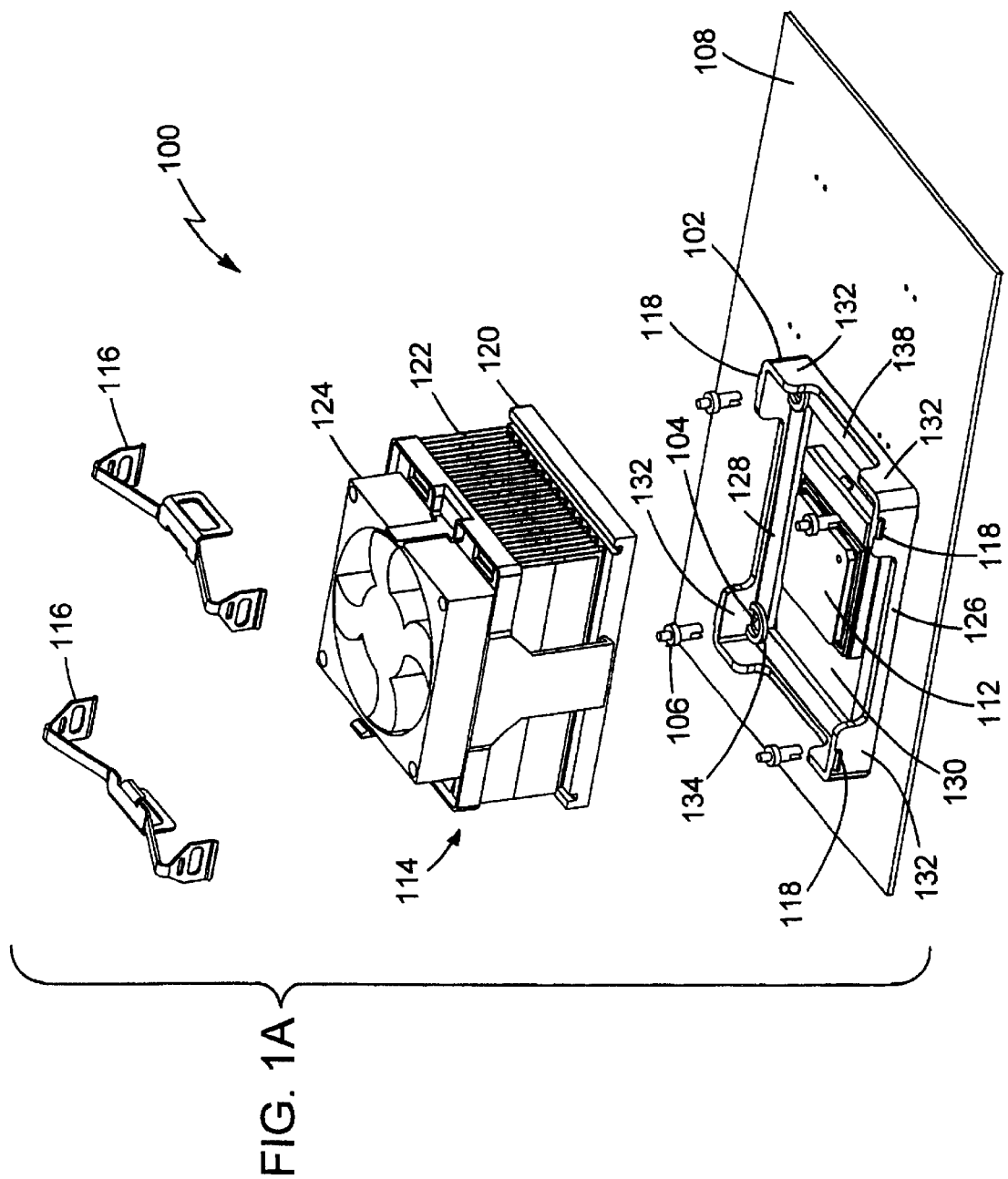

HEAT SINK RETENTION FRAME

BACKGROUND

The invention relates to heat sink retention frames.

Integrated circuit chips can produce a large amount of heat when operating. A heat sink is a mass of thermally conductive material that can be used, for example, in conjunction with an integrated circuit chip to remove heat associated with the operation of the chip. Retention frames can assist in maintaining a good thermal connection between an integrated circuit chip and an associated heat sink in various environmental conditions, including mechanical shock events. Such mechanical shock events can occur if an electronic assembly is dropped.

BRIEF DESCRIPTION OF THE DRAWINGS

FIG. 1A is an exploded view of an assembly including a heat sink retention frame.

DETAILED DESCRIPTION

Figure 1B:
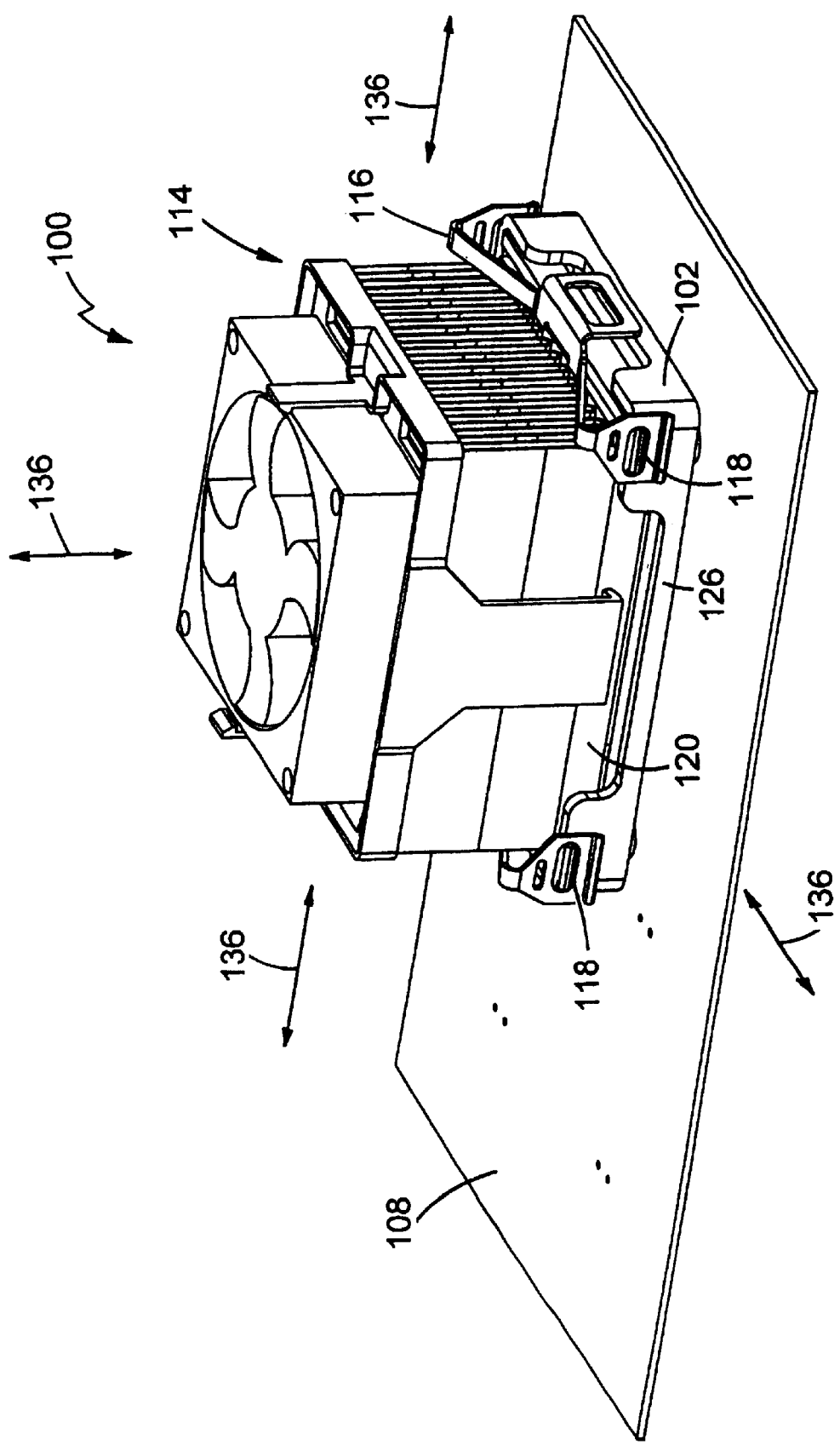
FIG. 1B illustrates an assembly including a heat sink retention frame.

The assembly 100 of FIGS. 1A and 1B includes a single-piece heat sink retention frame 102. The frame 102 includes holes 104 for receiving fastening devices 106 to secure the frame 102 to a printed circuit board 108. The frame 102 includes four substantially coplanar structural members.

An integrated circuit chip 112 is secured to the printed circuit board within the frame 102. A heat sink 114 can be secured to the frame 102 by attaching securing straps 116 to the frame 102. Each securing strap 116 can be attached to the frame 102 at both ends by mating the ends with lips 118 positioned at an outer surface of the frame 102. Each securing strap 116 includes a portion configured to mate with a portion of the heat sink 114.

Each lip 118 is positioned near one of the four corners of the frame 102. Two lips 118 are arranged on each of two opposite, parallel sides of the frame. The lips 118 protrude a small distance outward from an upper part of the outer surface of the respective sides facing away from the aperture 130.

The heat sink 114 includes a thermally conductive base 120 that maintains thermal contact with the integrated circuit chip 112 during operation. The heat sink 114 also has cooling fins 122 and a fan 124.

The structural members include vertically oriented members 126 and horizontally oriented members 128. The vertically oriented members 126 define an aperture 130. The horizontally oriented members 128 are structural extensions that project from a lower section of the vertically oriented members 126 inwardly toward the aperture 130 and define an area for receiving the integrated circuit chip 112.

The aperture 130 is sized to at least partially receive the base 120 of the heat sink 114. The fit between the base 120 of the heat sink 114 and the vertically oriented members 126 can be either snug or loose, but some tolerance should be allowed.

The vertically oriented members 126 have a height that varies around the perimeter of the aperture 130. Each vertically oriented member 126 includes a reinforced portion 132 located near a corner of the aperture 130 and a narrow portion 138 spanning a distance between corners of the aperture 130. As illustrated, the reinforced portions 132 have a greater height than other areas of the vertically oriented members 126 and can improve the mechanical load bearing capability associated with the frame 102. The narrow portions 138 can provide a reduction in size, weight and manufacturing cost associated with the frame 102.

The horizontally oriented members 128 include an extension 134 near each corner of the aperture 130 that protrudes inwardly toward the aperture 130. The extensions 134 are positioned so that they pass at least partially beneath the heat sink 114 when assembled. This arrangement may be desirable so that in the event of a mechanical shock event, any movement of the heat sink in a direction toward the printed circuit board can be arrested by one or more extension 134.

If, for example, the assembly 100 is dropped onto a surface, the force may cause the heat sink 114 to move in a direction or combination of directions indicated by the arrows 136 (in FIG. 1B). When this happens, the heat sink 114 may move until it contacts a portion of the frame 102 intended to stop the motion.

In the event of a laterally oriented mechanical shock event, the vertically oriented members 126 can absorb a resultant lateral force and stop the heat sink from moving in a lateral direction, thereby ensuring that the heat sink 114 does not become dislodged from its corresponding integrated circuit chip 112.

In the event of a downwardly oriented mechanical shock event, the extensions 134 can absorb a resultant downward force and prevent the heat sink from crushing or otherwise damaging the integrated circuit chip 112.

When assembled, the distance between an upper surface of the reinforced portions 132 and the printed circuit board 108 is at least greater than the distance between an upper surface of an integrated circuit chip 112 and the printed circuit board 108. The distance is also greater than a distance between the bottom surface of the heat sink 114 and the printed circuit board 108. If reinforced portions 132 are not included in the frame 102, then the same relative spatial criteria should apply to an upper surface of the vertically oriented members 126.

Figure 2:
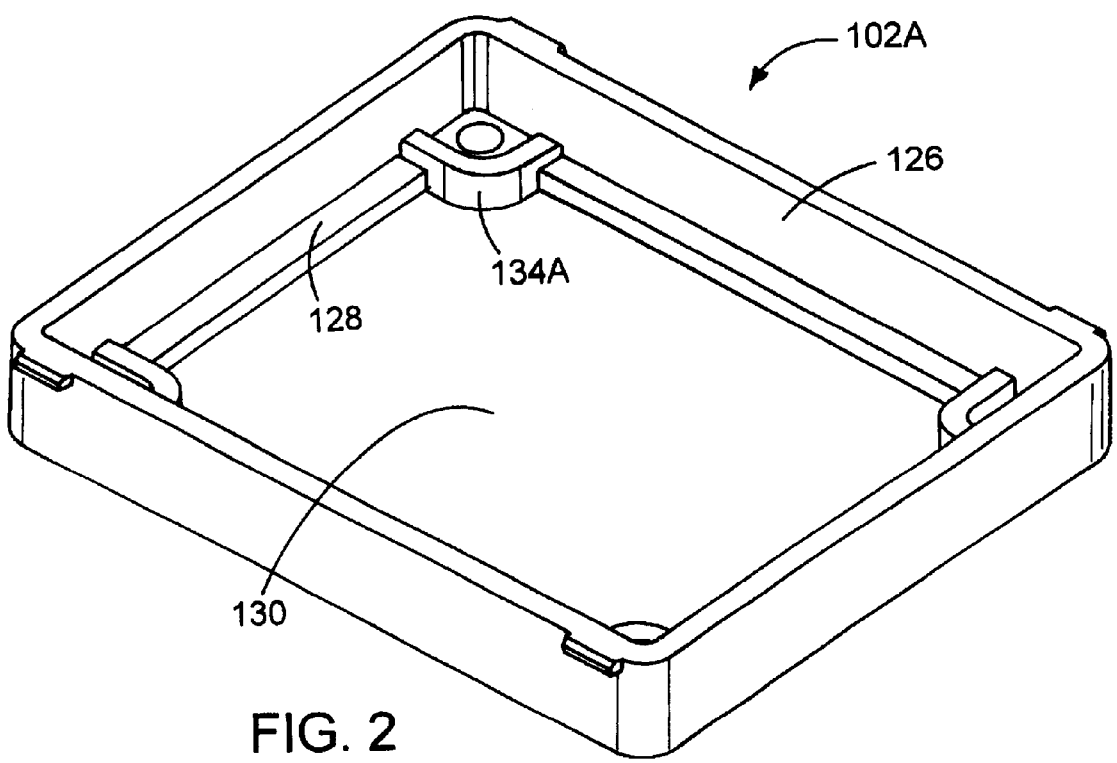
FIG. 2 is a perspective view of a heat sink retention frame.

In the single-piece heat sink retention frame 102A of FIG. 2, the vertically oriented members 126 can have a common height around the entire perimeter of the frame 102A.

The extensions 134A project inwardly toward the aperture 130 and have a height that is greater than the height of other areas of the horizontally oriented members 108. This height difference ensures that, when an assembly using the frame 102B is exposed to a downwardly oriented mechanical shock, an associated heat sink (not shown) should contact the extensions 134A and not other areas of the horizontally oriented members 128. The other areas of the horizontally oriented members 128 can provide enhanced structural integrity to the vertically oriented structural members 126.

The single-piece frame 102A can be cast as a single integral structure formed, for example, by an injection molding technique, or can be formed by using separate components and securely attaching them to each other using an adhesive or using other fastening techniques. The term single-piece encompasses either an integrally formed structure or multiple components fastened to each other.

Figure 3:
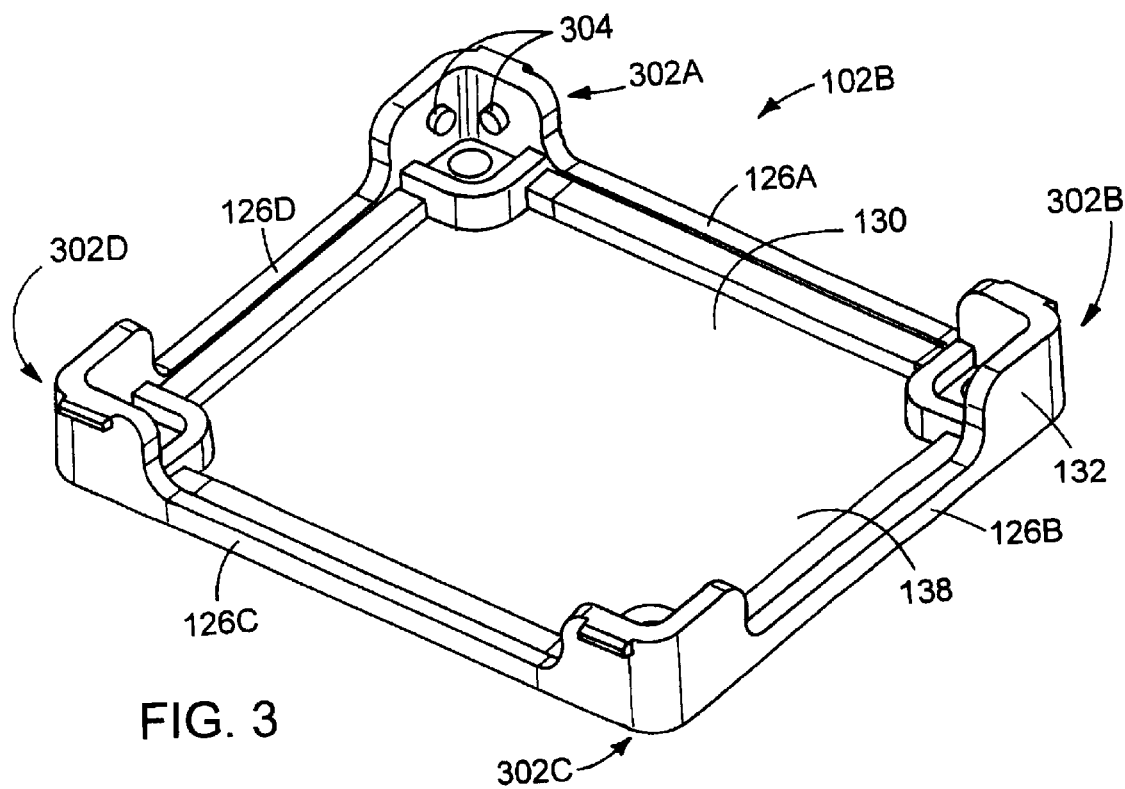
FIG. 3 is a perspective view of another heat sink retention frame.

In the frame 102B of FIG. 3, the reinforced portions 132 of adjacent vertically oriented members 126A, 126B, 126C and 126D define a vertical extension 302A, 302B, 302C, 302D at each corner of the aperture 130. The vertical extensions 302A, 302B, 302C, 302D have greater heights than the narrow portions 138 of the vertically oriented members 126A, 126B, 126C and 126D. Vertical extensions 302A, 302B, 302C, 302D are positioned to span a corner of the aperture 130 defined by the intersection of a first vertically oriented member and a second adjacent and perpendicular vertically oriented member. For example, the vertical extension 302B spans a corner defined by the intersection of vertically oriented members 126A and 126B.

The vertically oriented members 126A, 126B, 126C, 126D also include cylindrical tabs 304 that extend inward toward the aperture 130 from the reinforced portions 132. The tabs 304 are positioned to transfer an incident force resulting from a mechanical shock to a reinforced portion 132 of an associated vertically oriented member 126A, 126B, 126C, and 126D.

Figure 4:
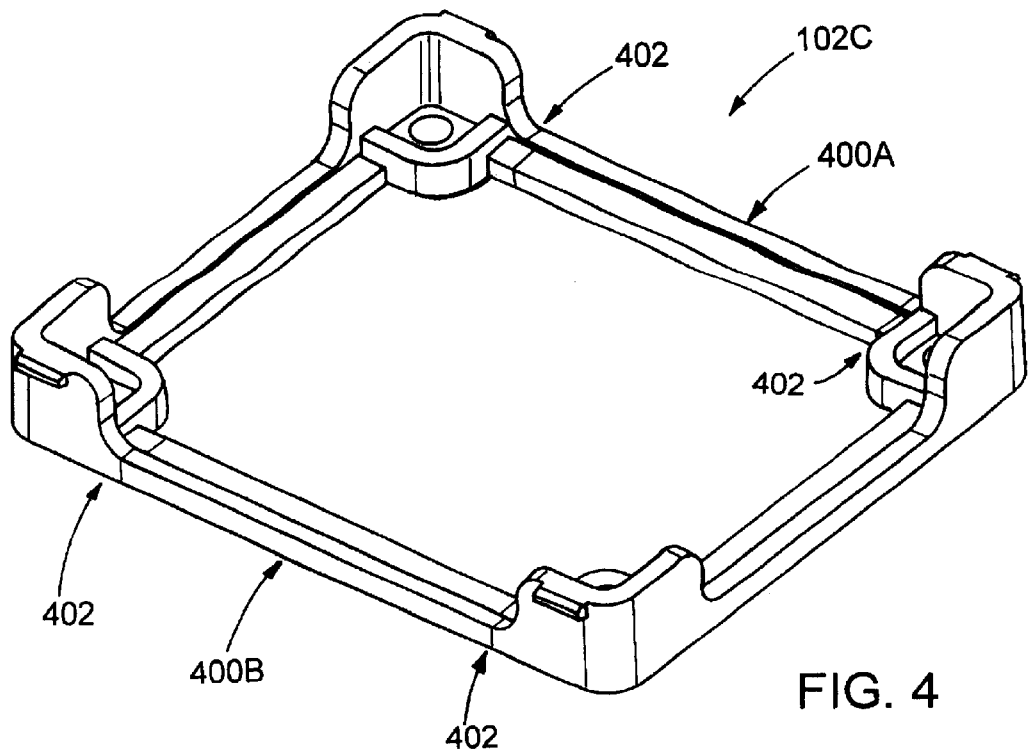
FIG. 4 is a perspective view of a third heat sink retention frame.

The frame 102C of FIG. 4 includes two parallel structural members 400A and 400B that are removable. Structural members 400A and 400B can be securely attached to the other components of the frame with a snap-in connection 402 at four places. Other methods of attachment may be used including, for example, adhesives. An arrangement that includes removable structural members may provide an electronic assembly manufacturer with the option of choosing a frame having either relatively high mechanical load-bearing capabilities or a frame that uses a comparably low amount printed circuit board space.

A manufacturer of electronic components utilizing a single-piece heat sink retention frame 102 may subject the assembly to a testing regiment to evaluate the retention frame's 102 performance during exposure to a mechanical shock condition. To accomplish that, the manufacturer can expose the electronic assembly to a laterally oriented mechanical shock and observe that the heat sink retention frame 102 properly restricts lateral movement of the heat sink to within the confines defined by the retention frame. The manufacturer can confirm that the tab 304 properly transfers any resultant force associated with the lateral movement of the heat sink to a structurally reinforced portion 132 of the retention frame 102.

The manufacturer also can expose the electronic assembly to a vertically oriented mechanical shock and observe that an extension 134 of the retention frame 102 properly limits the downward movement of the heat sink to a predetermined distance and that the extension 134 properly absorbs the resultant force associated with the downward movement of the heat sink.

Electronic assemblies incorporating the foregoing techniques may realize one or more of the following advantages. Dislodging of heat sinks under mechanical shock conditions may be minimized. Also, the reliability of thermal connections between heat sinks and their associated integrated circuit chips may be improved.

Modifications of the techniques are possible. For example, various materials such as may be used to manufacture heat sink retention frames. Different shapes and sizes of frames may be implemented in certain situations. The relative positions of various frame features can be varied. For example, fastening device holes may be positioned elsewhere. Also, tabs may be cylindrical, square or other shapes.

Other implementations are within the scope of the following claims.

What is claimed is:

1. An assembly comprising:
   a printed circuit board;
   a single-piece heat sink retention frame secured to the printed circuit board, the frame comprising structural members surrounding an aperture with corners defined by the intersection of adjacent structural members;
   wherein each structural member comprises a reinforced portion at each corner, the reinforced portions defined by a height that extends a greater distance above the printed circuit board than a corresponding narrow portion and each reinforced portion being integrally coupled to a reinforced portion of an adjacent structural member;
   an integrated circuit chip secured to the printed circuit board and positioned within the aperture; and
   a heat sink secured to the frame and positioned above the integrated circuit chip, the heat sink being at least partially within the aperture.

2. The assembly of claim 1 wherein the frame comprises extensions that project from the structural members at least partially into the aperture, the extensions defining an area to receive the integrated circuit chip.

3. The assembly of claim 2 wherein the aperture includes four corners and each extension comprises a protrusion from a corner of the aperture, the protrusions extending at least partially beneath the heat sink.

4. The assembly of claim 2 wherein each extension comprises an upper surface at a distance from the printed circuit board, the distance being less than a distance between an upper surface of the integrated circuit chip and the printed circuit board.

5. The assembly of claim 1 wherein each structural member comprises an upper surface at a distance above the printed circuit board, the distance being larger than a distance between a lower surface of the heat sink and the printed circuit board.

6. The assembly of claim 1 wherein the frame comprises holes for receiving fastening elements to secure the frame to the printed circuit board.

7. The assembly of claim 1 wherein each reinforced portion comprises a tab extending toward the aperture from a vertical surface of an associated reinforced portion.

8. The assembly of claim 1 wherein the frame comprises lips extending away from the aperture to securely mate with a heat ink securing strap.

9. The assembly of claim 1 wherein a portion of two parallel structural members are removable.

10. The assembly of claim 1 wherein the frame forms a single integral structure.

11. An apparatus comprising a single-piece heat sink retention frame comprising substantially coplanar structural members and extensions projecting inward from each of the structural members, the extensions surrounding a first part of an aperture to receive an integrated circuit chip mounted to a printed circuit board, each structural member comprising a reinforced portion near each corner of the aperture, each reinforced portion extending above the printed circuit board a greater distance than a corresponding narrow portion of the structural member, the structural members surrounding a second part of the aperture to at least partially receive a heat sink positioned above the integrated circuit chip.

12. The apparatus of claim 11 wherein each reinforced portion comprises a cylindrical tab extending inward toward the first part of the aperture from a vertical surface of the reinforced portion.

13. The apparatus of claim 11 wherein a portion of two parallel structural members is removable.

14. The apparatus of claim 11 wherein the frame is integrally formed.

15. The apparatus of claim 11 comprising a lip to mate with and secure a heat sink securing strap to the frame.

16. The apparatus of claim 11 comprising:

a hole for receiving a fastening element to secure the frame to a printed circuit board; and a lip positioned near each corner, each lip being configured to securely mate with a heat sink securing strap;

wherein the structural members comprise reinforced portions positioned near each corner of the aperture, the reinforced portions comprising tabs that extend inward toward the aperture from a vertical surface of each reinforced portion.

17. An assembly comprising:

a circuit board;

a single-piece frame mounted to the circuit board for fastening a heat sink thereto, the frame comprising vertically oriented members surrounding a substantially rectangular aperture, each vertically oriented member comprising a reinforced portion near each corner of the aperture and a narrow portion that spans between reinforced portions;

an integrated circuit chip positioned within the aperture; and a heat sink fastened to the frame and positioned above the integrated circuit chip, the heat sink positioned at least partially within the aperture so that, under a mechanical shock condition, the heat sink is movable in a lateral direction to contact a reinforced portion to prevent the heat sink from dislodging.

18. The assembly of claim 17 wherein each reinforced portion is integrally coupled to a reinforced portion of an adjacent vertically oriented member.

19. The assembly of claim 17 wherein each reinforced portion has a height above the circuit board that is greater than a height of an associated narrow portion.

20. The assembly of claim 17 wherein the frame further comprises horizontally oriented members, each horizontally oriented member extended from inwardly facing surface of an associated vertically oriented member toward the aperture, wherein each horizontally oriented member extends at least partially beneath the fastened heat sink.

21. The assembly of claim 17 wherein each reinforced portion comprises a cylindrical tab extended from an inwardly-facing surface of a reinforced portion, toward the aperture.

* * * * *